United States Patent [19]

Kley

[11] Patent Number: 5,566,023
[45] Date of Patent: Oct. 15, 1996

[54] STEPPED LENS WITH FRESNEL SURFACE STRUCTURE PRODUCED BY LITHOGRAPHY AND PROCESS FOR MANUFACTURING OF SAME

[75] Inventor: Ernst-Bernhard Kley, Jena, Germany

[73] Assignee: Jenoptik Technologie GmbH, Jena, Germany

[21] Appl. No.: 360,805

[22] PCT Filed: Apr. 26, 1994

[86] PCT No.: PCT/EP94/01307

§ 371 Date: Dec. 28, 1994

§ 102(e) Date: Dec. 28, 1994

[87] PCT Pub. No.: WO94/25881

PCT Pub. Date: Nov. 10, 1994

[30] Foreign Application Priority Data

Apr. 29, 1993 [DE] Germany ............. 43 14 574.4

[51] Int. Cl.⁶ ............. G02B 27/44; G02B 5/18; G03H 5/00
[52] U.S. Cl. ............. 359/569; 359/565; 359/742
[58] Field of Search ............. 359/565, 566, 359/569, 742, 743; 385/33

[56] References Cited

U.S. PATENT DOCUMENTS

| | | | |
|---|---|---|---|
| 3,893,856 | 7/1975 | Bestenreiner et al. | |
| 4,733,943 | 3/1988 | Suzuki et al. | 359/565 |
| 4,994,664 | 2/1991 | Veldkamp | 359/565 |
| 5,130,531 | 7/1992 | Ito et al. | 359/565 |
| 5,227,915 | 7/1993 | Grossinger et al. | 359/569 |
| 5,345,336 | 9/1994 | Aoyama et al. | 359/569 |
| 5,359,684 | 10/1994 | Hosokawa et al. | 385/33 |

FOREIGN PATENT DOCUMENTS

| | | |
|---|---|---|
| 1772567 | 7/1971 | Germany. |
| 59-105605 | 6/1984 | Japan ............. 359/565 |
| 391702 | 4/1991 | Japan. |

OTHER PUBLICATIONS

Cuadrado et al, "Zone Plates Produced by Cylindrical Wavefronts: Recording and Reconstruction", Optica Acta, vol. 29, No. 6, Jun. 1982, pp. 717 to 723.
"Technologie hochintegrierte Schaltungen" by D, Widmann, Springer Verlag, 1988 pp. 115–116.
"Zns Micro–Fresnel Lens and its Uses" in the journal *Applied Optics*, vol. 29, #34, Dec. 1990, pp. 5106–5110.
Applied Optics, Bd.26, Nr.3, 1 Feb. 1987, New York, NY, pp. 587–591 (T. Shiono, et al) "Rectangular–Apertured Micro–Fresnel Lens Arrays Fabricated by Electrron–Beam Lithography".

*Primary Examiner*—Jon W. Henry
*Attorney, Agent, or Firm*—McAulay Fisher Nissen Goldberg & Kiel, LLP

[57] ABSTRACT

In a stepped lens with a Fresnel surface structure produced by lithography and a process for fabricating same, the high potential exposure speed of high-speed electron-beam exposure systems which work with variable rectangular beam cross sections is converted in such a way that stepped Fresnel type lenses can be fabricated with high efficiency and, in so doing, the required amounts of data is reduced. According to the invention, radiation dose distributions which correspond to cylindrical lenses are exposed one upon the other, at least one of the radiation dose distributions corresponding to a Fresnel type cylindrical lens.

Lens structures with any desired lens curvature, from radially spherical to elliptical, can be efficiently produced by lithography by the disclosed process.

5 Claims, 8 Drawing Sheets

X IN μm 5,566,023

STEPPED LENS WITH FRESNEL SURFACE STRUCTURE PRODUCED BY LITHOGRAPHY AND PROCESS FOR MANUFACTURING OF SAME

BACKGROUND OF THE INVENTION

1. Field of the Invention

The invention is directed to a stepped lens with a Fresnel surface structure produced by lithography and with a radially symmetric or elliptic-optical effect by superimposing radiation dose proportions or distributions of cylindrical lenses with cylinder axes which are angularly offset relative to one another.

The subject of the present invention is further directed to a process for the fabrication of stepped lenses in which a resist coating is structured by superimposed exposure of two radiation dose distributions of cylindrical lenses with angularly offset cylinder axes and by a subsequent development process in which a development front is stopped from progressing into the depth of the coating.

2. Description of the Related Art

Lens structures must have great accuracy laterally and in profile. Lithographic methods for fabricating lenses with limited dimensions have been known for a long time. In principle, lithographic processes working with light beams, electron beams, x-ray beams or ion beams are suitable for producing such profiles. However, in many cases the problem of prolonged processing times arises in writing methods. This is because it is necessary to break up the curved structure geometries into a large number of structure details which must be processed to represent the profile surface.

This circumstance can be illustrated with reference to the production of a refractive micro-lens array by electron beam lithography. The process upon which this example is based is known as "variable dose writing" and makes use of the fact that the rate at which an electron-sensitive resist dissolves in the developer bath can be determined beforehand by the electron dose introduced in the resist. Accordingly, it is possible to design the electron dose distribution in such a way that the desired surface profile is obtained by interrupting the development after a certain period of time. This procedure is illustrated schematically in FIG. 1.

In the case of radially symmetric lens curvature of the individual lens and a finite vertical graduation in the profile, ring-shaped regions of uniform electron doses must be processed. When the lens is bounded by squares for efficient arrangement in the array, the outer rings of equal electron dosage are not closed. Due to the resulting large amount of data, each individual lens is processed relatively slowly. Very rapid electron-beam exposure systems work with a variable shaped beam having a rectangular cross section. However, their potential exposure speed can only be utilized if the square electron probe parallel to the coordinate axes can be used over the greatest possible surface area. But this is impossible in the present example, since a great many small squares must be processed to approximate the circular ring. FIG. 2 is a schematic illustration of the breaking up of a circular ring into squares. Even when using a high-speed electron-beam exposure system, the resulting processing times are unacceptably long.

According to the German Offenlegungsschrift 17 72 567, it is known to generate different optical path lengths by means of suitable, periodically changing exposure and subsequent development and re-halogenation and/or tanning development of a photographic coating. Gratings or rasters of spherical lenses are formed by exposing two systems of lines lying vertically or perpendicularly relative to one another in a square arrangement. It is disadvantageous that only lens rasters with lenses of substantially identical design and low optical quality can be produced using this solution.

OBJECT AND SUMMARY OF THE INVENTION

It is a primary object of the present invention to convert the high potential exposure speed of high-speed electron-beam exposure systems which work with variable rectangular beam cross sections in such a way that stepped Fresnel type lenses can be fabricated with high efficiency and, in so doing, to reduce the required amounts of data.

According to the invention, this object is met by a stepped lens produced by lithography and having a Fresnel type surface structure with radially symmetrical or elliptic-optical effect brought about by superimposing radiation dose distributions of cylindrical lenses with cylinder axes which are angularly offset relative to one another in that at least one radiation dose distribution corresponds to a Fresnel type cylindrical lens for producing the surface structure.

In a special stepped lens produced by lithography, the surface structure is produced by superimposing the radiation dose distributions of two Fresnel type cylindrical lenses with cylinder axes which are directed at right angles to one another and has steps in the form of adjacent step elements which are embedded in a grid formed by their flanks which are oriented at right angles to one another, this grid becoming more closely spaced with increasing distance from the center of the lens, wherein the flanks, together with the center, form locations of equal height at their intersections and at points on the normal line from the center to the flanks. For every step element, there are reductions in height proceeding from the locations of equal height. These reductions in height are identical from flank to flank in every direction vertical to the flanks and facing the edge of the lens and correspond to the sum of the reductions in height of a stepped element occurring from flank to flank in the direction of the intersections situated the farthest from the edge of the lens.

The reductions in height in the directions vertical to the flanks are advantageously of a magnitude such that a phase jump corresponding to the integral multiple of a wavelength is realized.

The subject of the invention is further directed to a process for the manufacture of Fresnel type stepped lenses in which a resist coating is structured by superimposed exposure of two radiation dose distributions of cylindrical lenses with cylinder axes which are angularly offset and by a subsequent developing process in which a development front is stopped from progressing into the depth of the coating. At least one of the radiation dose distributions which are exposed one above the other corresponds to a Fresnel type cylindrical lens.

In an advantageous manner, one radiation dose distribution corresponds to a Fresnel lens profile and the other radiation dose distribution corresponds to a classic lens profile.

It is also advantageous when both radiation dose distributions correspond to a Fresnel lens profile.

Further, it is advantageous when both radiation dose distributions correspond to a classic lens profile.

It is also possible to carry out the required exposures one after the other first and then to develop within a limited period of time or to carry out alternate exposure and development.

It is possible by means of the invention to provide three-dimensionally curved surfaces in the form of exposure data for lithographic pattern generators in a very efficient manner. The data for the individual structure in question are on a comparatively small scale and can be processed in suitable systems (e.g., exposure systems with variable shaped beams) considerably faster than the extensive amounts of data occurring when the ring structure is broken down.

Further, by means of the invention, in particular by combining and varying the number and arrangement of the cylindrical lens profiles, it is possible to produce a large number of Fresnel lenses with determined characteristics with a limited store of relatively simply structured data records for specific dose distributions. By contrast, in ring-shaped lithographic fabrication of Fresnel lenses, a complete revision of the data record was required for each change.

In addition, the Fresnel lenses which are fabricated according to the invention and which correspond in their action to a Fresnel lens with a conventional ring structure possess improved characteristics with respect to chromatic aberration due to their surface structuring, in particular as a result of the special step gradients.

Accordingly, it is possible to expose a plurality of dose profiles having different optical functions one on top of the other. The non-orthogonal arrangement of the cylinder axes provides parallelogram-shaped edge boundaries and flank arrangements of the lens profiles. A round lens edge is formed in refractive lens profiles when the thickness of the resist coating is so determined that development reaches through to the substrate at a certain vertical contour line. Lens arrays are produced by multiple arrangement of the individual structures adjacent to one another. The invention can be applied in a corresponding manner to a binary structuring with masking technique and etching steps.

The lens profiles produced according to the invention are shaped by electrodeposition and replicated in a known manner for the fabrication of lenses.

For a better understanding of the present invention, reference is made to the following description and accompanying drawings while the scope of the invention will be pointed out in the appended claims.

BRIEF DESCRIPTION OF THE DRAWINGS

In the drawings:

FIG. 4b shows a profile of a cylindrical lens produced by a dose distribution according to FIG. 4a;

FIG. 5b shows a profile of a cylindrical lens produced by a dose distribution according to FIG. 5a;

FIG. 6b shows a profile of a classic radial lens produced by superposition of dose distributions according to FIG. 6a;

DESCRIPTION OF THE PREFERRED EMBODIMENTS

Figure 1:
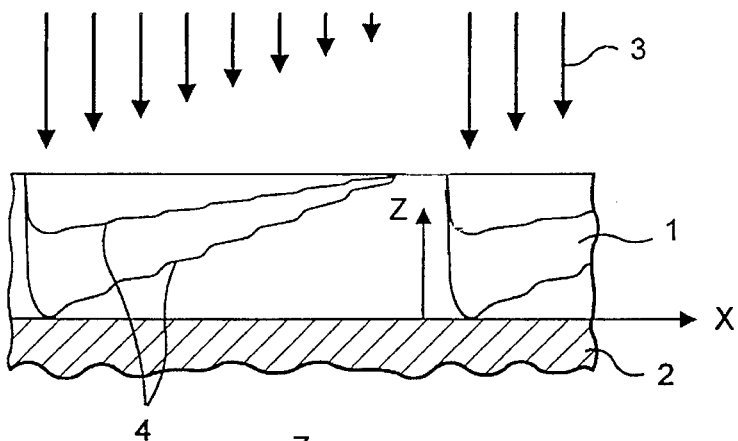
FIG. 1 shows the production of a surface profile by electron beam exposure and subsequent development.

FIG. 1 shows the technical process for fabricating a surface profile in a resist coating 1 which is applied to a substrate 2. The solubility of the resist coating 1 is modified by means of electron beam exposure 3 with variable dose in the x direction in such a way that a development front 4 is formed in the developing process. Depending on the exposure and development time, a defined structure occurs in the resist coating 1 after the development is interrupted. In FIG. 1, this is a stepped structure formed in the x direction.

Figure 2:
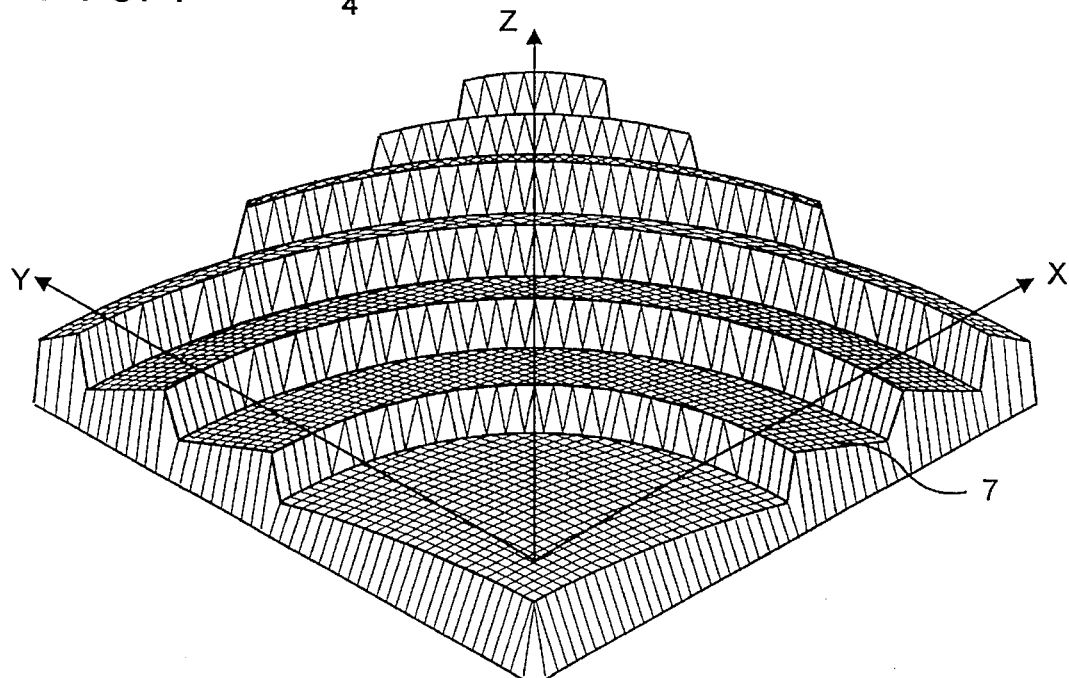
FIG. 2 shows a section from a conventional Fresnel lens.
Figure 3:
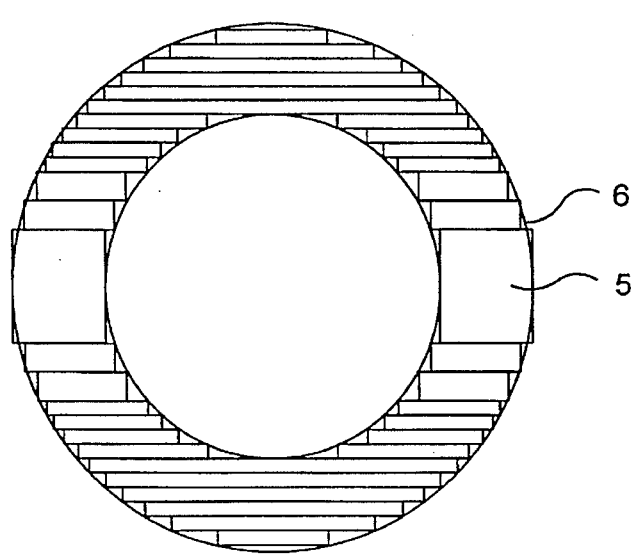
FIG. 3 shows the production of a circular ring by breaking up into rectangles.

An exposure process using large amounts of data is required to produce Fresnel lenses of the type shown in FIG. 2 by this technical process. FIG. 3 shows how a circular ring 6 must be broken up for this purpose into rectangles 5 whose dimensions and shape are determined by the bundle of electron beams designed as a shaped beam. Every working surface 7 of the Fresnel lens is divided into a plurality of vertical steps, each of which corresponds to a circular ring 6. A specific dose is associated with each circular ring 6.

Figure 4B:
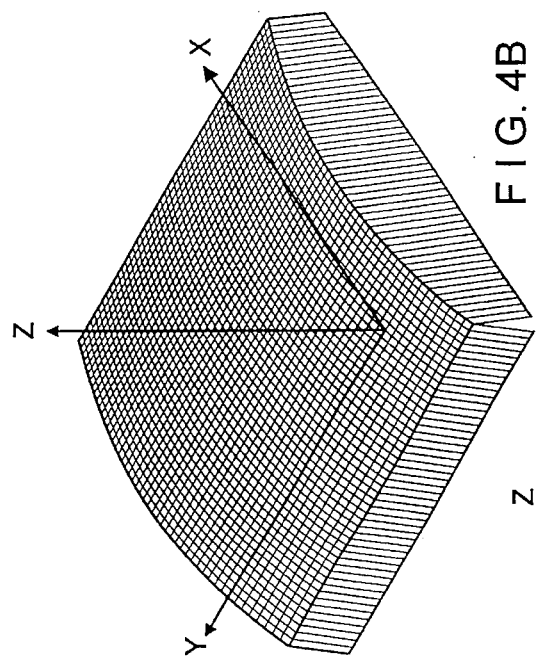
Figure 5B:
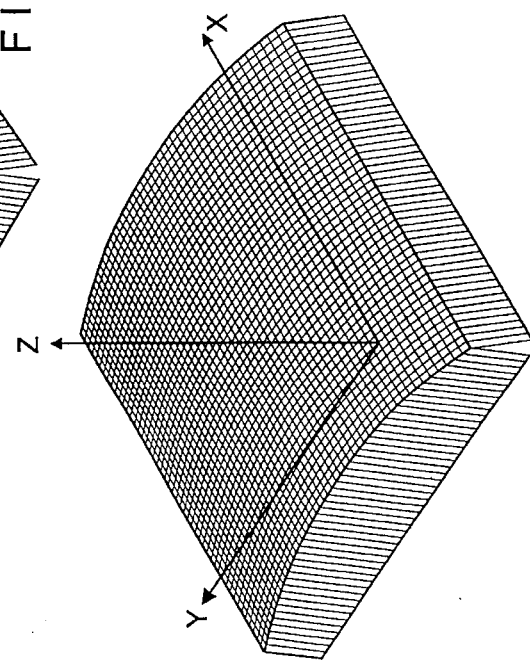
Figure 4A:
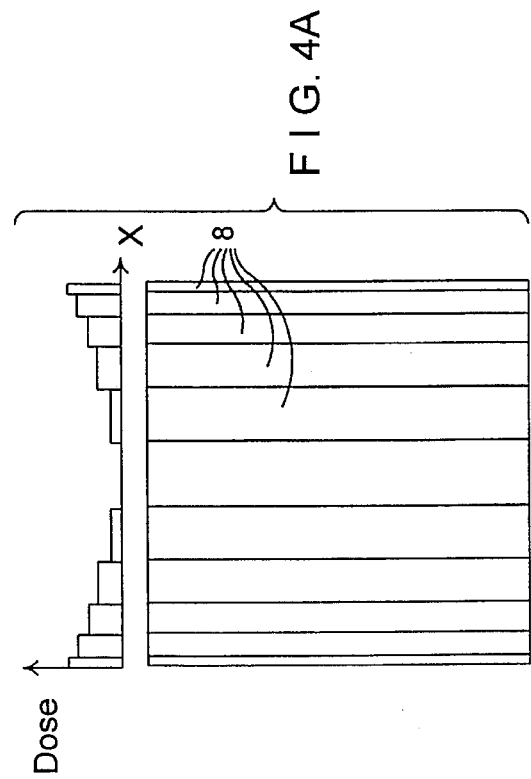
FIG. 4a shows a dose distribution for a first cylindrical lens profile formed in the x direction on a Cartesian coordinate system.
Figure 5A:
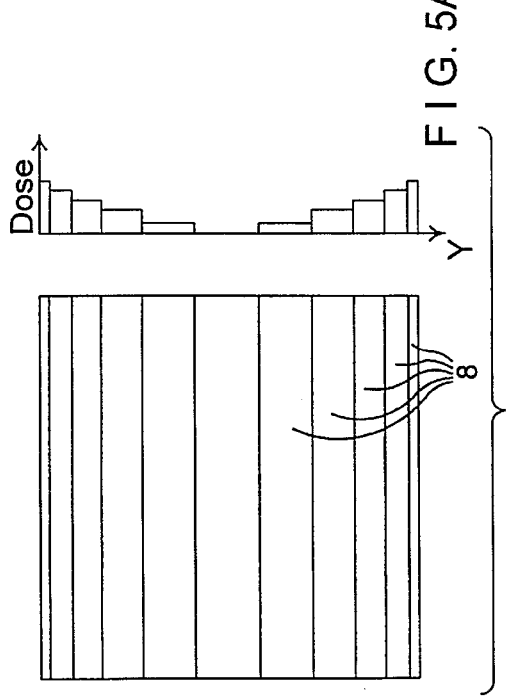
FIG. 5a shows a dose distribution for a second cylindrical lens profile formed in the y direction in the Cartesian coordinate system.
Figure 6B:
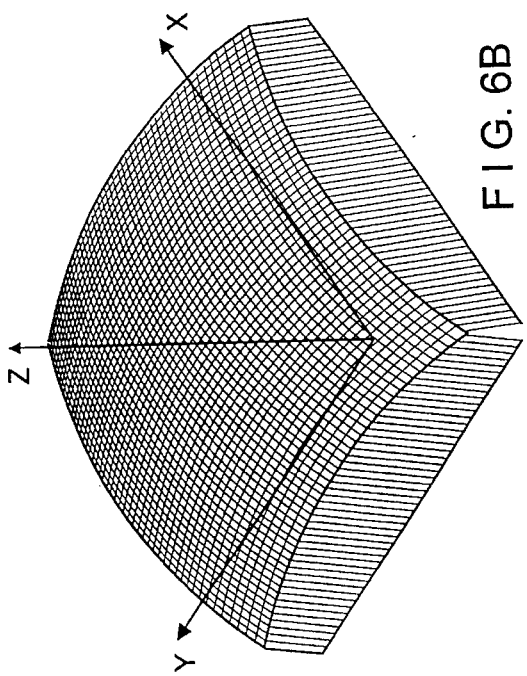
Figure 6A:
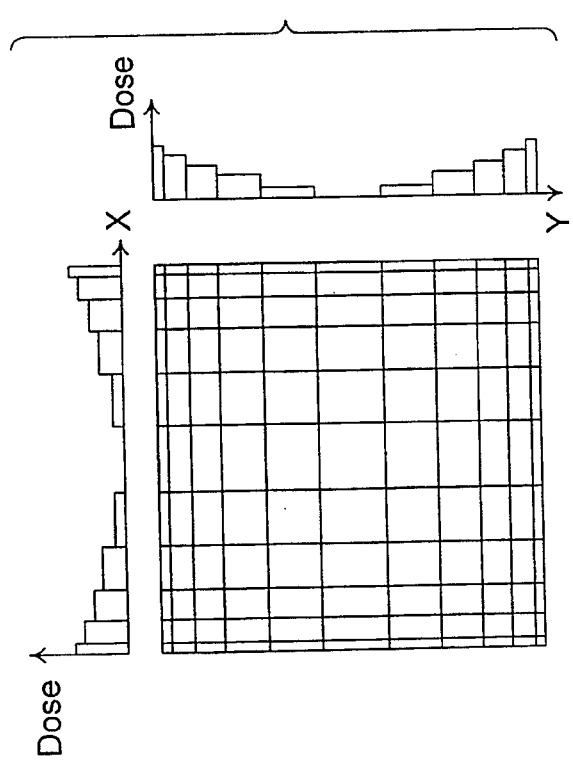
FIG. 6a shows dose distributions for a classic radial lens with square surface area.

FIGS. 4 to 6 show how refractive micro-lens profiles can be fabricated using determined dose distributions. Curved surfaces corresponding to FIGS. 4b and 5b are formed by exposing and developing a sufficiently large number of rectangles 8. A radial lens of the classic type with a square surface area according to FIG. 6b is formed by superimposing the dose distributions of cylindrical lenses with cylinder axes oriented at right angles to one another and a square surface area according to FIG. 6a. Its focal length is equal to the focal length of the cylindrical lenses.

Figure 7B:
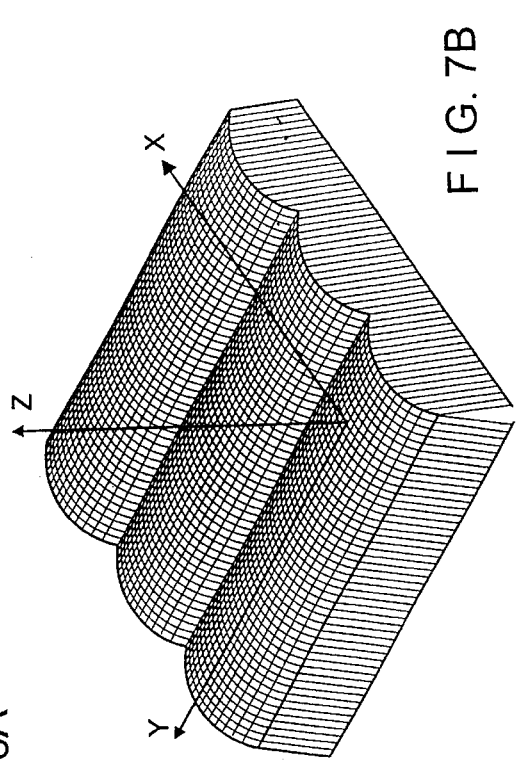
FIGS. 7a, 7b show profiles of cylindrical lens arrays with cylinder axes oriented at right angles to one another.
Figure 7A:
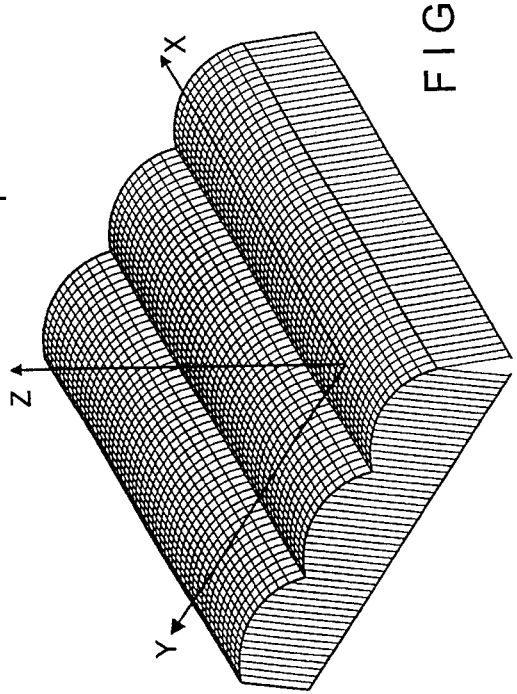

FIGS. 7a–d show examples for the fabrication of lens arrays with square surface area of the individual lens by superimposing dose distributions of two cylindrical lens arrays according to FIGS. 7a, b with cylinder axes oriented at right angles to one another.

A refractive lens array can be produced with the following parameters:

focal length: 5 mm refractive index: 1.5 lens material: PMMA lens magnitude: 150 μm lens boundary: square number of lenses: 660*660

Figure 7C:
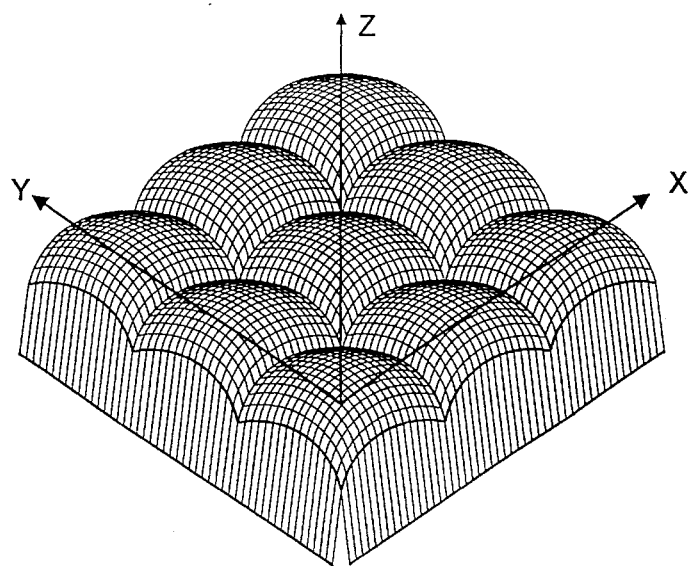
FIG. 7c shows a profile of a lens array by superimposed dose distributions corresponding to the profiles of FIGS. 7a, 7b.
Figure 7D:
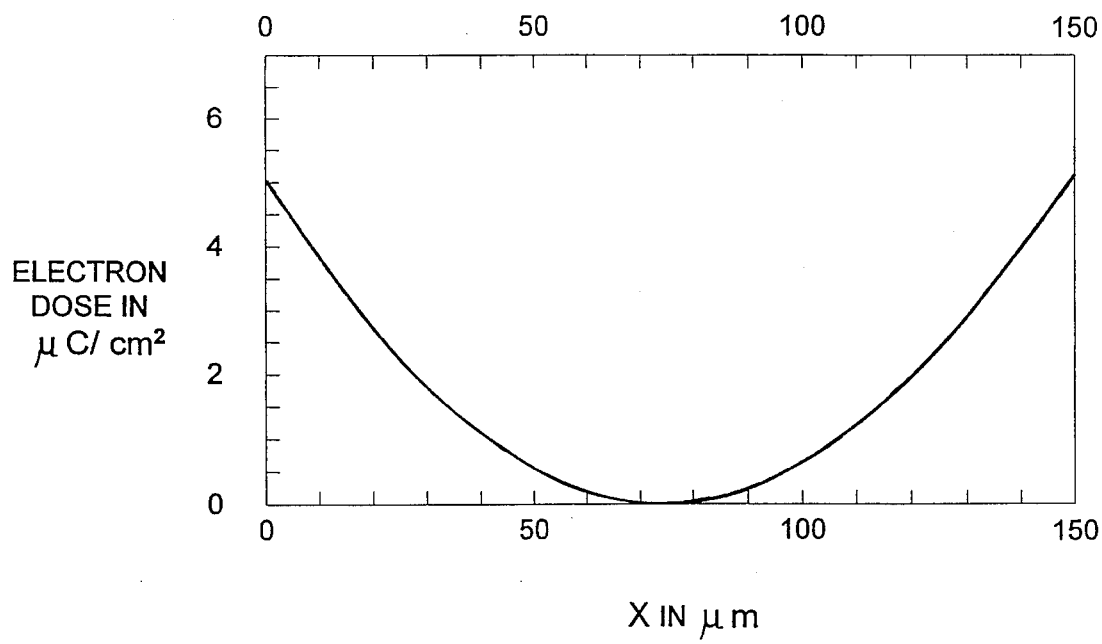
FIG. 7d shows a dose distribution.

A 5" mask blank (glass substrate coated with approximately 80 nm chromium) is coated with an electron resist (PMMA copolymer). Two data records are required for the subsequent electron beam exposure. A first data record is used to write a dose distribution for 660*660 cylindrical lens profiles with a refractive power in the x direction (FIG. 7a). FIG. 7d shows the ideal dose distribution in the x direction for a lens profile; the dose is constant in the y direction (150 μm). This dose distribution is approximated by 90 dose steps, each of which corresponds to a rectangular structure surface (rectangle) to be exposed. A second data record writes the same array into the resist coating at a 90-degree rotation (FIG. 7b). After developing for a limited period of time, the surface profile is completely formed (FIG. 7c).

The minimal number of rectangular surfaces (rectangles) required for one half of a cylindrical lens profile is equal to the number of dose steps (in this instance 90). Thus, there are 360 rectangles for the total of four halves of the two intersecting or crossed cylindrical lenses. A further optimization is possible due to the arrangement of the lenses in the array by overlaying adjacent rectangles. Processing the same lens structure according to the conventional process of radial division corresponding to FIG. 2 results in at least 18,980 rectangles. When the data is processed on an electron beam exposure system, comparison between the two variants shows that the required time is reduced by a factor of approximately 30 when applying the process according to the invention.

Figure 8A:
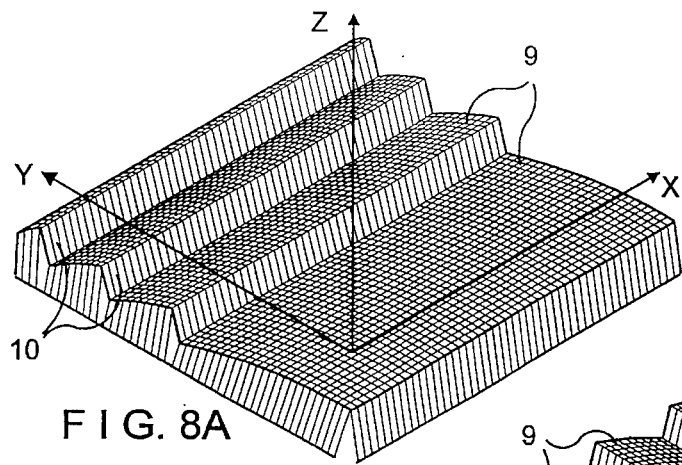
FIGS. 8a, 8b show portions of cylindrical lens profiles having a Fresnel surface structure.
Figure 8B:
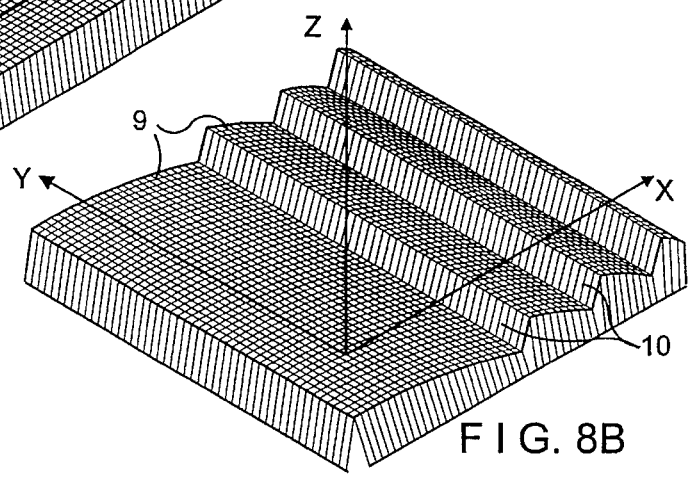
Figure 8C:
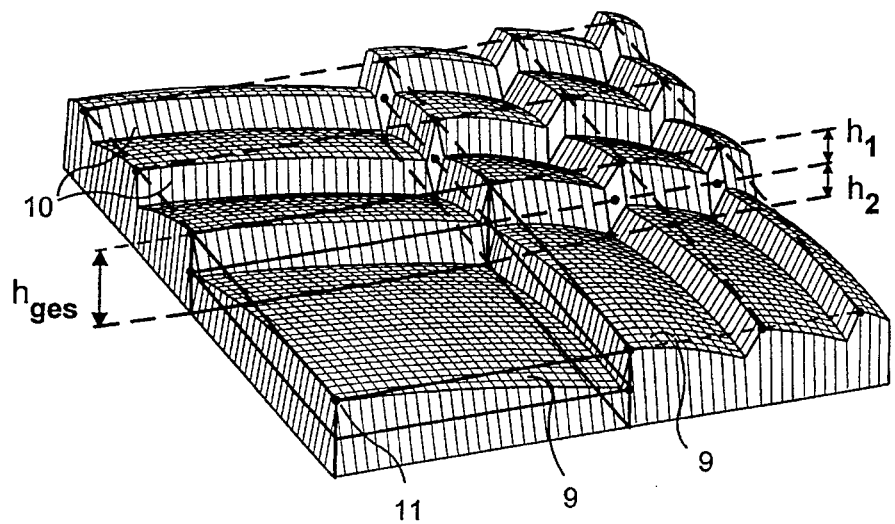
FIG. 8c shows a section from a Fresnel lens according to the invention which is produced by superimposing dose distributions of the cylindrical lens profiles according to FIGS. 8a, 8b.
Figure 9A:
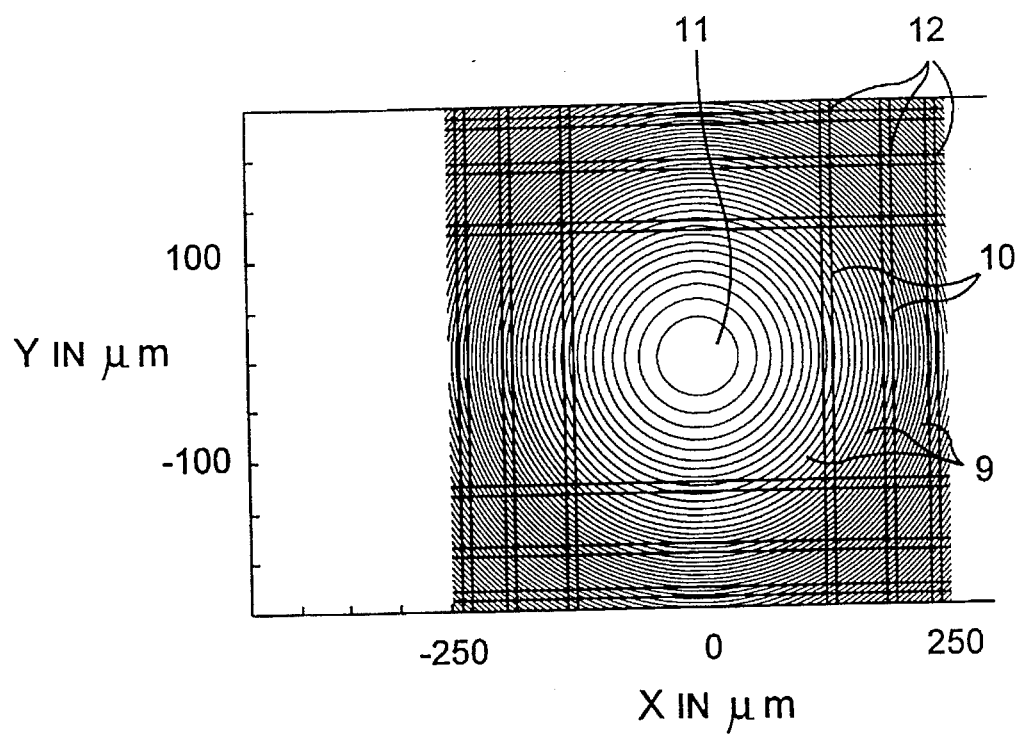
FIG. 9a shows a top view of a Fresnel lens with square boundary according to the invention.
Figure 9B:
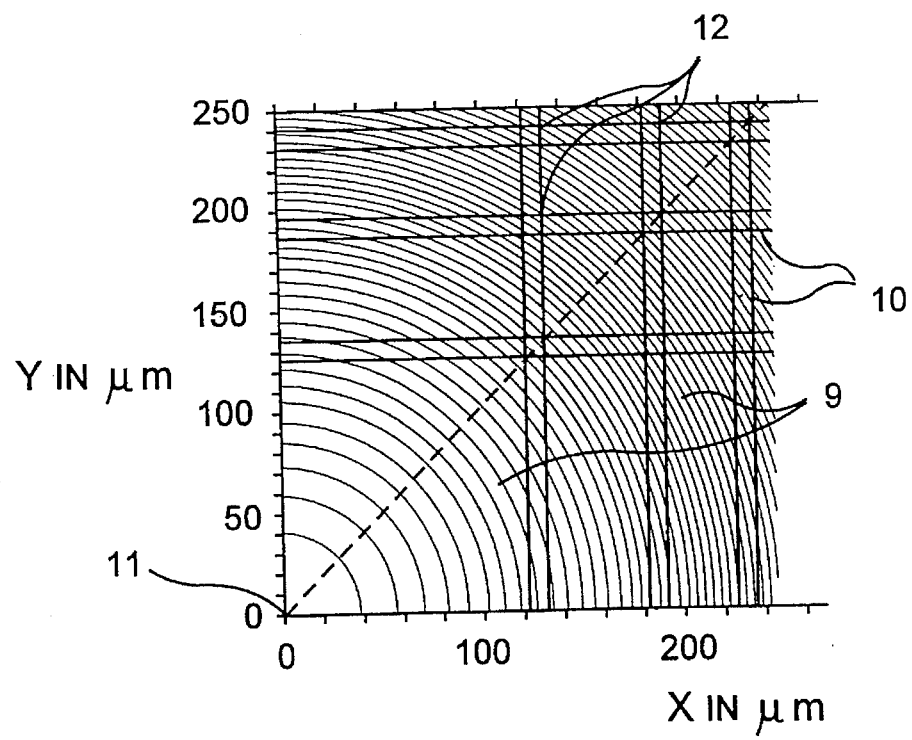
FIG. 9b shows a top view of the section according to FIG. 8c.
Figure 10:
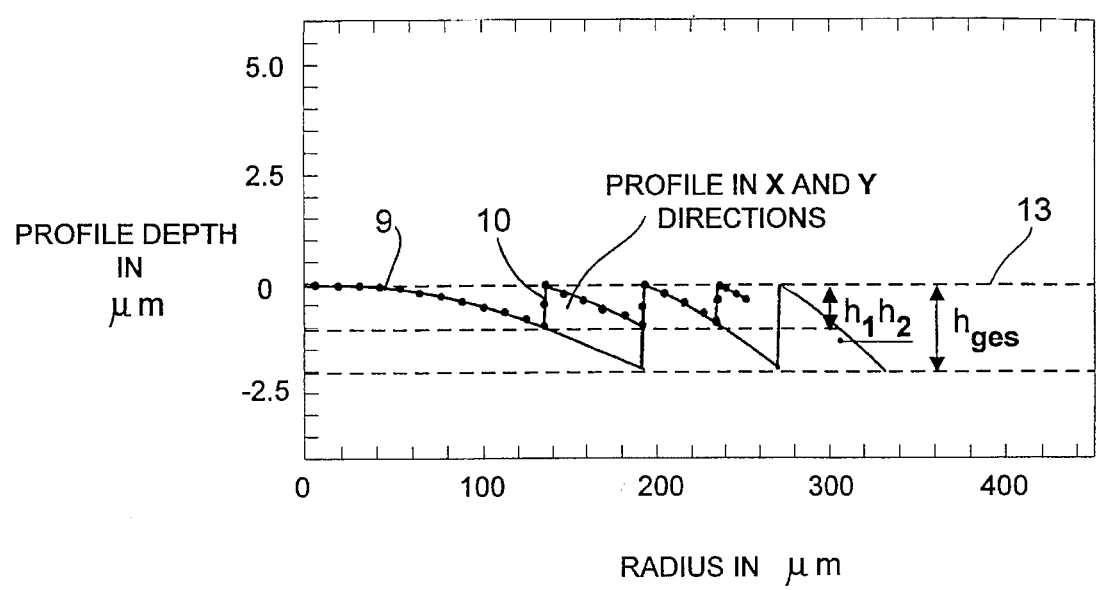
FIG. 10 shows a view of the height profile of a Fresnel lens according to the invention.

FIGS. 8 to 10 show the production of a Fresnel lens according to the invention by superimposing dose distributions corresponding to Fresnel type cylindrical lenses with cylinder axes oriented at right angles to one another. Of course, this can be modified by different combinations of dose distributions corresponding to structured cylindrical lenses, wherein the cylinder axes can enclose a practicable angle deviating from 90°. The invention can be used to produce lens profiles with radially symmetric or elliptic-optical action.

According to FIGS. 8 and 9, the Fresnel lens has steps in the form of adjacent step elements 9 which are embedded in a grid formed by their flanks 10 which are directed at right angles to one another, this grid becoming more closely spaced with increasing distance from the center 11 of the lens.

The flanks 10, together with the center 11, form locations of equal height at their intersections 12 and at points on the normal line from the center 11 to the flanks 10. Depending on direction, there are reductions in height $h_1$, $h_2$ and $h_{ges}$ in every step element proceeding from these locations of equal height. For the sake of simplicity, only part of the step elements 9, flanks 10 and intersections 12 are shown.

In each direction vertically to the flanks 10 and facing the edge of the lens, there are identical reductions in height from flank to flank in a direction $h_1$ and in a direction $h_2$ vertical thereto. The height reductions $h_1$ and $h_2$ can be identical or different. In the direction of the intersection 12 situated farthest from the edge of the lens, the height reductions $h_{ges}$ correspond to the sum of $h_1$ and $h_2$.

This situation is illustrated again in FIG. 10 by the height profile of the Fresnel type cylindrical lens section corresponding to FIGS. 8c and 9b. If the Fresnel type cylindrical lens were placed in a Cartesian coordinate system, height reduction $h_1$ would lie in the x direction and height reduction $h_2$ would lie in the y direction, wherein $h_1=h_2$ in the present example. The height reductions $h_{ges}$ are in the direction of the intersection 12 situated farthest from the edge of the lens.

The magnitude of height reductions $h_1$ and $h_2$ is such that a phase jump of the integral multiple of a wavelength can be realized. The flanks 10 rise virtually vertically from the lowest point substantially corresponding to an intersection 12 until the resist surface 13. The height reductions $h_1$, $h_2$ and $h_{ges}$ follow in the outward direction.

Figure 11A:
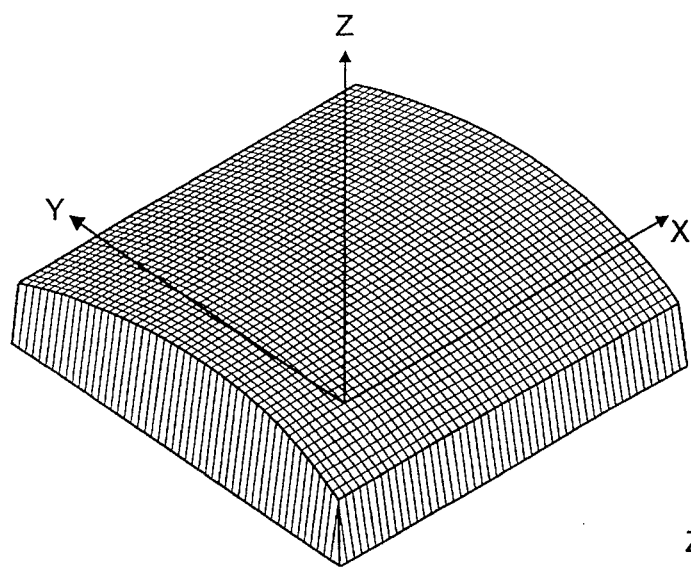
FIG. 11a shows a profile of a cylindrical lens.
Figure 11B:
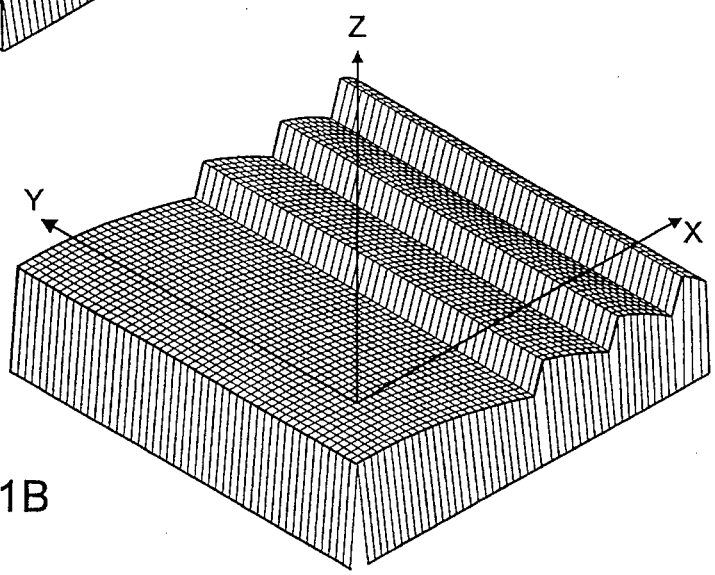
FIG. 11b shows a profile of a Fresnel type cylindrical lens.
Figure 11C:
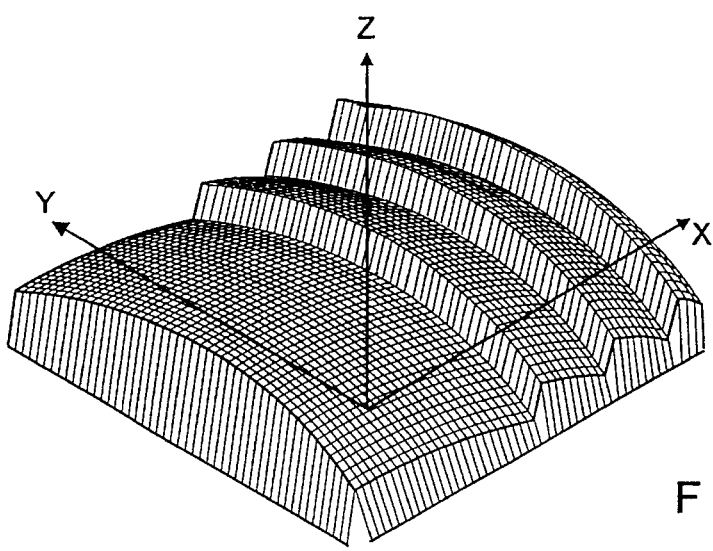
FIG. 11c shows a lens profile according to the invention which is formed by the superposition of profiles according to FIGS. 11a, 11b.

FIGS. 11a–11c show the fabrication of a Fresnel lens with curved Fresnel zones in the z direction along the x axis by superimposing the dose which corresponds to a cylindrical lens and a dose corresponding to a Fresnel type cylindrical lens.

Naturally, the invention is not limited exclusively to the use of electron beams. Light beams, x-ray beams and ion beams can also be used.

While the foregoing description and drawings represent the preferred embodiments of the present invention, it will be obvious to those skilled in the art that various changes and modifications may be made therein without departing from the true spirit and scope of the present invention.

What is claimed is:

1. A stepped lens with a Fresnel surface structure produced by lithography and having a radially symmetric or elliptic-optical effect, wherein the surface structure is produced by consecutively superposing the radiation dose distributions of two Fresnel type cylindrical lenses with cylindrical axes which are directed at right angles to one another and has steps in the form of adjacent step elements which are embedded in a grid formed by their flanks which are oriented at right angles to one another, said grid becoming more closely spaced with increasing distance from the center of the lens, wherein the flanks, together with the center, form locations of equal height at their intersections and at points on the normal line from the center to the flanks, and wherein for every step element there are reductions in height proceeding from the locations of equal height, said reductions in height being identical from flank to flank in every direction vertical to the flanks and facing the edge of the lens and corresponding to the sum of the reductions in height of a stepped element occurring from flank to flank in the direction of the intersections situated the farthest from the edge of the lens.

2. The stepped lens produced by lithography according to claim 1, wherein the height reductions in directions vertical to the flanks are of a magnitude such that a phase jump of an integral multiple of a wavelength is realized.

3. A process for the manufacture of Fresnel type stepped lenses in which a resist coating is structured comprising the steps of:

consecutively exposing said resist coating to two superposed radiation dose distributions cylindrical lenses with angularly offset cylinder axes, at least one of said radiation dose distributions corresponding to a Fresnel type cylindrical lens; and utilizing a subsequent development process in which a development front is stopped from progressing into the depth of the coating.

4. The process according to claim 3, wherein one radiation dose distribution corresponds to a Fresnel lens profile and the other radiation dose distribution corresponds to a classic lens profile.

5. The process according to claim 3, wherein both radiation dose distributions correspond to a Fresnel lens profile.

\* \* \* \* \*